United States Patent
Honkura

(10) Patent No.: US 9,404,980 B2
(45) Date of Patent: Aug. 2, 2016

(54) MAGNETOMETERS

(71) Applicant: MAGNEDESIGN CORPORATION, Chita-gun, Aichi-ken (JP)

(72) Inventor: Yoshinobu Honkura, Chita-gun (JP)

(73) Assignee: MAGNEDESIGN CORPORATION, Chita-gun (JP)

( * ) Notice: Subject to any disclaimer, the term of this patent is extended or adjusted under 35 U.S.C. 154(b) by 0 days.

(21) Appl. No.: 14/763,221

(22) PCT Filed: Jan. 22, 2014

(86) PCT No.: PCT/JP2014/051261
§ 371 (c)(1),
(2) Date: Jul. 24, 2015

(87) PCT Pub. No.: WO2014/115765
PCT Pub. Date: Jul. 31, 2014

(65) Prior Publication Data
US 2015/0355294 A1 Dec. 10, 2015

(30) Foreign Application Priority Data

Jan. 25, 2013 (JP) ................................. 2013-012698

(51) Int. Cl.
*G01R 33/02* (2006.01)
*G01R 33/09* (2006.01)
*G01R 33/00* (2006.01)

(52) U.S. Cl.
CPC ............ *G01R 33/09* (2013.01); *G01R 33/0023* (2013.01)

(58) Field of Classification Search
CPC ........ G01R 33/02; G01R 33/09; G01R 33/23; G01R 33/26; G01R 33/63; H01L 43/00; G01B 7/00; G01B 7/34

See application file for complete search history.

(56) References Cited

U.S. PATENT DOCUMENTS 7,026,812 B2  4/2006  Honkura et al.
7,224,161 B2 * 5/2007  Honkura ................ G01R 33/02
                                                           324/247

(Continued)

FOREIGN PATENT DOCUMENTS

JP   S63-142289 A   6/1988
JP   H11-64475 A    3/1999

(Continued)

OTHER PUBLICATIONS

Sep. 2, 2014 Office Action issued in Japanese Application No. 2014-509967.

(Continued)

*Primary Examiner* — Minh N Tang
(74) *Attorney, Agent, or Firm* — Oliff PLC

(57) ABSTRACT

The magnetometers possess a detector part with a magneto-sensitive material sensitive to the magnetic field and coil surrounding its magnetosensitive material to pick-up the magnetic field, a pulse generator circuit supplies pulse current to the magnetic material, a sample holding circuit including with an electronic switch synchronized with pulse timing for switching on/off and holding capacitance to charge electricity produced by the pickup coil during the switch on period, and an amplifier circuit amplifies the holding capacitance voltage. Magnetometers possess a Buffer circuit connecting the output side of the pickup coil with the input side of the Buffer circuit and connects the output side of the Buffer circuit with the input side of the electronic switch to transfer the pulse signal voltage induced in the pickup coil from the input side to the output side keeping the pulse signal voltage of the outside at the same level as the inside.

4 Claims, 2 Drawing Sheets

(56) References Cited

U.S. PATENT DOCUMENTS

| | | | |
|---|---|---|---|
| 8,063,634 B2 * | 11/2011 | Sauber | B82Y 25/00 324/244 |
| 8,610,427 B2 | 12/2013 | Honkura et al. | |
| 2006/0038561 A1 | 2/2006 | Honkura et al. | |
| 2011/0080164 A1 | 4/2011 | Honkura et al. | |
| 2012/0038358 A1 | 2/2012 | Honkura et al. | |

FOREIGN PATENT DOCUMENTS

| | | |
|---|---|---|
| JP | 2000-258517 A | 9/2000 |
| JP | 2001-221839 A | 8/2001 |
| JP | 2003-329745 A | 11/2003 |
| JP | 2008-134236 A | 6/2008 |
| JP | 2009-025280 A | 2/2009 |
| JP | 2009-145074 A | 7/2009 |
| JP | 2010-256109 A | 11/2010 |
| JP | 4655247 B2 | 3/2011 |
| WO | 2005/019851 A1 | 3/2005 |
| WO | 2009/119081 A1 | 10/2009 |

OTHER PUBLICATIONS

Nov. 18, 2014 Decision of Allowance issued in Japanese Application No. 2014-509967.

Apr. 28, 2014 Search Report issued in International Application No. PCT/JP2014/051261.

* cited by examiner

MAGNETOMETERS

TECHNICAL FIELD

The present invention relates to magnetometers capable to make high sensitivity, low noise and low power consumption.

BACKGROUND ART

The magnetometers are used to detect a foreign substance, the earth magnetism, the attitude of the mobile devices and so on. Recently the small type of magnetometers is equipped to mobile computer terminals such as mobile phones and smart phones. One of the typical types of these small magnetometers is the magneto impedance sensor equipped with a MEMS (Micro Electro Mechanical Systems) pickup coil operated by pulse current.

The magneto impedance sensor based on the magneto impedance effect (MI effect) which causes the change of the impedance of the magnetic wire having the compromise of CoFeSiB alloy especially which has amorphous wire proportional to the external magnetic field due to the surface effect of the high frequency current is one of the magnetometers. The type of the coil pickup is one of the magneto impedance sensor to detect the voltage induced in the pickup coil surrounded around the magnetic wire. The type of the pulse current operation is one of the magneto impedance sensor to use the pulse current instead of the high frequency current. The type of the coil pickup operated by the pulse current is called as MI sensor merely in the present invention. These MI sensor is referred in the following Japanese patent application and relating circuit.

CITATION LIST

Patent Literature

[PTL 1]
Japanese Unexamined Patent Application Publication No. 2008-134236
[PTL 2]
Japanese Unexamined Patent Application Publication No. 2009-25280

SUMMARY OF INVENTION

Technical Problem

The basic concept on MI sensor operated by pulse current through the magnetic wire sensitive to the magnetic field is to detect the change of the impedance according to the magnetic field by the means of the voltage (signal voltage) induced in the pickup coil. According to FIG. 2 in the PTL 1 or FIG. 2 in the PTL 2, it is clear that the current type of MI sensor equip the direct connection with the pickup coil and the holding capacitance through the electric switch. In the case, the current following through the circuit including the pickup coil by the voltage induced and the electric switch charges the holding capacitance directly and the voltage between both terminals of the holding capacitance (the holding voltage) is amplified to put out as the output signal voltage. Thus analog circuit is effective for the detecting circuit of MI sensor in the case that the resistance (R) of the pickup coil and the capacity of the holding capacitance (C) are reasonably or considerably low which detects to the voltage between both terminals of the holding capacitance after flowing the current directly from the pickup coil to the holding capacitance.

However sensitive or lower noise to keep its small size is requested to MI sensor recently. One of technical means to increase the sensitivity of MI sensor is well-known to make coil pitch smaller or finer by producing the small gap between coils. To produce the fine pitch coil, the coil wiring produced by vapor process instead of plating process has been developed, but the thickness of the coil wiring is accompanied to become 5 μm to 0.5 μm and the resistance increase exponentially with the decrease of the coil cross section area and the increase of the coil length. As the result, the holding voltage of the holding capacitance decrease notwithstanding the increase of the coil numbers because the IR drop made by the current (I) induced by the coil voltage flowing the pickup coil and the relating circuit become bigger than the increase of the coil voltage induced in the pickup coil. Therefore the sensitivity of MI sensor cannot be increased by the fine pitch coil in the case to use the current analog type of signal detecting circuit.

It is considered that another method to make the noise of MI sensor lower would be to increase the capacity of the holding capacitance. Currently, the capacity of the holding capacitance of the commercial MI sensor is about 6 pF. If the capacity of the holding capacitance increase at least to 10 pF, it is possible to make the noise of MI sensor 10% to 30% lower. But when the capacity of the holding capacitance is increased under the condition to use the current analog detecting circuit, it is difficult for the holding capacitance to make full charge within the short rising time of pulse current so that the holding voltage of the holding capacitance decreases and the sensitivity of MI sensor decreases.

Moreover it is considered that one of method to decrease the power consumption would be to decrease the current strength supplied to the magnetic wire by means of the decrease of the pulse width or the numbers of pulse. However if the current analog detecting circuit is used, it is difficult to make holding capacitance full charge and to decrease the power consumption keeping the sensitivity of MI sensor.

The present invention has been achieved to solve the above technological problems. The purpose of the present invention is to offer the magnetometers equipping new type of the signal detecting circuit which can make high sensitivity, low noise and low power consumption possible.

Solution to Problem

The inventor found one idea after researching to solve these above problems in earnest and making a lot of try and errors that if a Buffer circuit is assembled between the pickup coil and the holding capacitance in addition to have the holding capacitance with big impedance as well as the pickup coil with big impedance, the output signal voltage on the holding capacitance circuit must be induced according to the input signal voltage offered from the pickup coil with high frequency (pulse converted frequency) It is discovered that the good performance of MI sensor such as the high sensitivity and low noise has been achieved by means of usage of a signal detecting circuit like digital to transfer the voltage of the pickup coil to that of the holding capacitance through the buffer circuit. Extending the result, the present invention has been reached to completion.

<<Magnetometer Apparatus>>

The magnetometers of the present invention posses a detector part with a magnetosensitive material to the magnetic field and a coil surrounding its magnetosensitive material to pick up the magnetic field, a pulse generator circuit to supply the pulse current to the magnetic material, a sample holding circuit comprising an electronic switch synchronized with pulse current timing for switching on/off and a holding capacitance to charge electricity produced by the pickup coil during the period of switch on, and an amplifier circuit to amplify the voltage of the holding capacitance during the period of switch off. In addition these magnetometers is characterized by possessing a Buffer circuit which connects the output side of the pickup coil with the input side of the Buffer circuit and connects the output side of the Buffer circuit with the input side of the electronic switch to transfer the pulse signal voltage induced in the pickup coil from the input side to the output side of the Buffer circuit to keep the pulse signal voltage.

The buffer circuit has the input side of the pickup coil with high impedance so that the current hardly flows through the pickup coil even though the coil voltage is induced. As a result, notwithstanding the resistance of the pickup coil increases by fine pitch coil, there is hardly the IR drop but even if it exists, it occurs very little. And the high voltage induced in the pickup coil is input to the input side of the Buffer circuit.

In general the output side of the Buffer circuit has a low impedance, but that of the present invention has considerably big impedance because the present magnetometers (MI sensor) has the holding capacitance with very small capacity of pF leves range from a few pF to a few ten pF in the output side which makes the impedance of the output side of the Buffer circuit, that is, the impedance of the sample holding circuit, too big by increasing reactance ($1/j \omega C$ where j means imaginable unit and $\omega$ means angular frequency of the signal frequency). The big impedance of the output side of the Buffer circuit suppress the current flow except a very short period after making the electronic switch on and the signal voltage input to the input side of the Buffer circuit is output as the almost same voltage from the output side of the Buffer circuit. In other words, the signal voltage of the input side of the Buffer circuit is transferred as a constant voltage to the output side of it and total circuit including from the pickup coil to the holding capacitance is formed as like digital signal detecting circuit which has both of the input side and the output side in high impedance.

Here is a concern that in the case that the input signal voltage has a high frequency, the voltage of the output side becomes small due to the low frequency band compared to the pulse converted frequency of 3 GHz. However a signal voltage with a stable high frequency is not input to the Buffer circuit but the pulse voltage with very short width compared to the time of the pulse cycle time is input to the circuit per a constant short time. In this case a general functionality or concept on frequency band is not applied to this situation and the output voltage of the Buffer circuit can be gained as according to the input voltage followed by the same holding voltage of the holding capacitance. The inventor found a concrete example that the Buffer circuit with the frequency band of about 100 MHz can transfer the pulse voltage with the converted frequency of 3 MGz from the input side to the output side with almost no loss. In the general case that the transformation of the high frequency makes the signal delay between the input side and the output side about 1 ns ($10^{-9}$ sec), the high frequency signal voltage with 0.2 GHz makes transformation difficult. However in the case that the pulse signal voltage is transformed, the buffer circuit with the delay of about 1 ns between the input side and the output side can transfer the signal and does not cause big problem. The present invention is achieved to perfection based on the above idea and discovery on the frequency band performance for the Buffer circuit to the pulse with the converted GHz frequency.

The digital like signal detecting circuit above described gives the functionality as bellows. A the moment switched on by the electronic switch the current flows into holding capacitance from the output side of the Buffer circuit and the holding capacitance is full charged according to the input voltage. Except this moment the voltage between both terminals between holding capacitance changes according to the voltage induced in the pickup coil with almost no decrease when the electronic switch is kept on. Finally at the moment the electric switch is made off around the time when the coil voltage becomes the maximum voltage, its voltage between both terminals of the holding capacitance is held as the holding voltage of the sample holding circuit to be output.

Moreover the holding capacitance is not directly charged by the current flowing through the pickup coil based on the voltage induced but is charged by the current supplied from the output side of the Buffer circuit. Within the limitation capable of keeping the functionality of the digital like signal detecting circuit the capacity of the holding capacitance can be increased from that of the conventional one. The magnetometers of the present invention can increase the capacity the holding capacitance and can improve properties in noise to keep or improve the sensitivity.

The above discussion claims that the range of the pulse inverted frequency must be 0.3 GHz to 3 GHz and the preferable range must be 0.4 GHz to 2 GHz. Here, the pulse inverted frequency is defined as $f=\frac{1}{4} \Delta t$ where f means the frequency, and $\Delta t$ means the rising time or falling time of the pulse current shown in FIG. 2.

It is preferable that when the pulse current has the pulse converted frequency of 0.3 GHz to 3 GHz, the buffer circuit has the frequency band of 0.3 GHz to 3 GHz according to the pulse converted frequency of the pulse current.

Moreover the holding capacitance must have the capacity of 10 pF to 100 pF and the preferable range is 12 pF to 30 pF. If the capacity is smaller than 10 pF, it is difficult to decrease the noise. If the capacity is too big, the voltage decrease within the pulse converted frequency band of the Buffer circuit because the impedance of the output side of the Buffer circuit becomes small so that it is difficult to form the digital like signal detecting circuit.

<<Others>>

The description of X to Y means to include the minimum value of X and the maximum value of Y without the remark about it. In addition the various values described in the summary invention is explained additionally to be A to B where A means the minimum value and B means the maximum value on various values.

BRIEF DESCRIPTION OF DRAWINGS

FIG. 2A is the wave voltage of the pulse current in.

DESCRIPTION OF EMBODIMENTS

The claims in the present description would be allowed to add one or over two elements selected from the present description to the basic elements of the present invention. The optimum embodiments depend on objects for the work and performance requested from applications.

Detector Part

The present invention is not related to concrete embodiments, materials and so on. To use an amorphous wire with zero magnetostriction as the magnetic material is preferable for achieving its small size and high sensitivity. A lot of patent which include magneto-impedance elements (MI element) have been applied. As examples, patent application of WO2005/19851, WO2009/119081, and Japanese Patent No. 4655247 and so on describe MI elements in details.

One MI element detects one direction of magnetic field vector. When 3 axis components of the magnetic field vector in 3 axis Cartesian coordinates are detected, three MI elements of which magnetic wire set parallel to X direction, Y direction and Z direction respectively are needed. But the patent of WO2005/19851 describes that it is possible to omit a part of MI elements according to applications.

By the way, the present description explains about basic parts comprising the magnetometers of the present invention. In other words, the magnetometers of the present invention are applied to one axis type which can detect one specialized direction of the magnetic field or three axis type which can detect three axis directions of the magnetic field.

Applications

The magnetometers of the present invention are applied not dependently to any applications. For examples of applications, they are applied to Mobile phone, smart phone, tablet, car navigation, digital camera, three dimensional mouse, motion capture, remote-controller for games which need the data on their attitude or directions together with small size, high sensitivity, and low consumption and so on.

Examples

Figure 1:
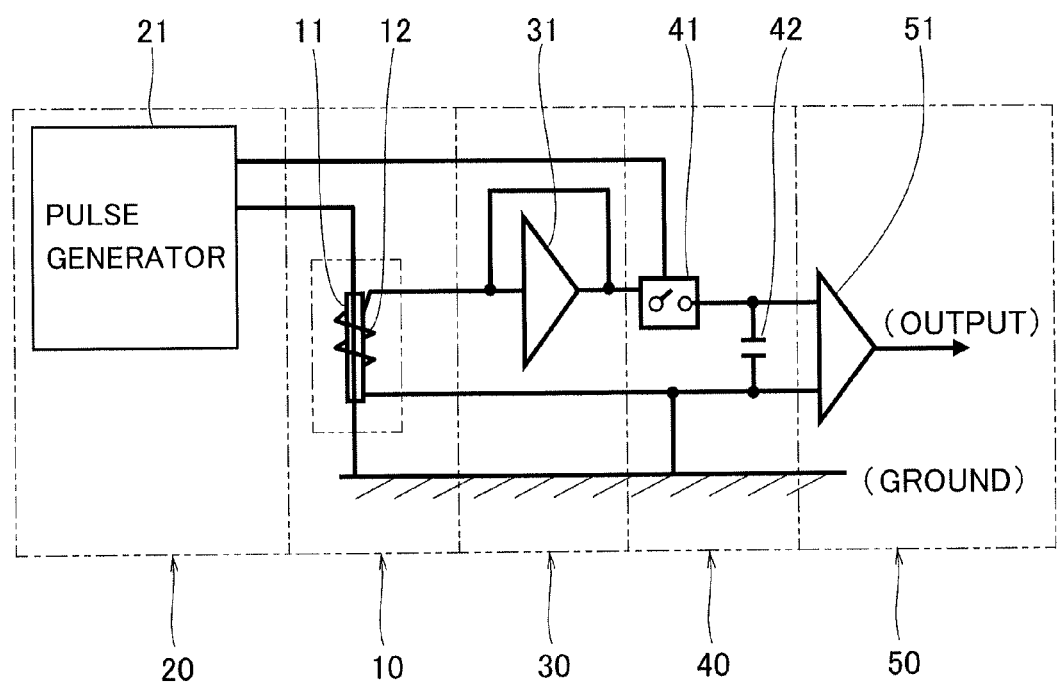
FIG. 1 is the circuit of the example magnetometer of the present invention.

An electric circuit drawing for one of the examples of the magnetometer 1 in the present invention is shown in FIG. 1. The magnetometer 1 comprises of the detector part 10, the pulse generator circuit 20, the Buffer circuit 30, the sample holding circuit 40 and amplifier circuit 50.

The detector part 10 is MI element which comprises of a magnetosensitive material 11 to the magnetic field made of CoFeSiB alloy amorphous wire and a pickup coil 12 surrounding its magnetic material to pick up the magnetic field. When the pulse current described bellow pass through the wire 11, the circular magnetic field changing according to the pulse is induced around the wire 11 and the pulse voltage induced in the coil 12 according to the change of dI/dt which are caused at the timing of rising time or falling time of the pulse. The change of the magnetization of the wire 11 induced by the circular magnetic field is influenced by the external magnetic field and is detected by the coil 12 to result the change of the coil voltage. The external magnetic field which exists surrounding the wire is detected with high accuracy by exact detection of the coil voltage induced in the coil 12. The pulse generator circuit 20 comprises of the pulse generator 21 which supply a designated pulse current to the wire 11. And it also supplies the control signal voltage with the generation of the pulse to the electronic switch 41 described below.

The buffer circuit 30 comprises of an amplifier 31 to give a function of the negative feedbackcircuit. The input side of the amplifier 31 has almost infinite impedance so that the voltage induced in the coil 12 is input to the amplifier 31 with almost no decrease. However the output side of the amplifier 31 has small impedance in general. In the case of the present invention the holding capacitance 42 has very small capacity so that the following circuit connecting to its output side has big impedance.

The sample holding circuit 40 comprises of the electric switch 41 and the holding capacitance 42. The electric switch 41 can make or break the circuit according to the control signal given from the pulse generator 21. The electric switch makes the circuit as on state during designated time operated by pulse current and breaks the circuit as off state at the moment to take a peak voltage induced in the pickup coil. This peak voltage between both terminals of the holding capacitance 42 is kept as the holding voltage.

The amplifier circuit 50 comprises of the differential circuit 51 which can amplify the holding voltage of the holding capacitance 42 against the grounding voltage. It is possible that the high frequency filter circuit is set on the input side of the amplifier 50 and the low pass filter circuit is set on the output side of the amplifier circuit.

Tests

Figure 2A:
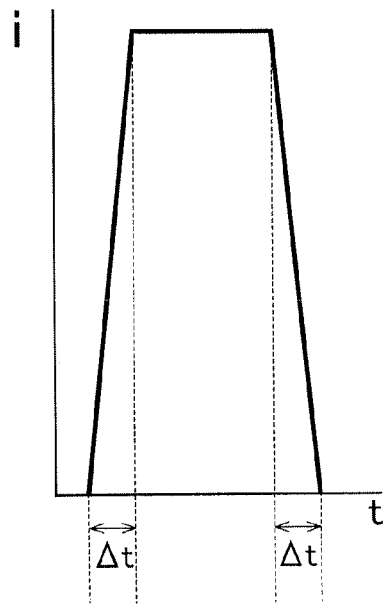
Figure 2B:
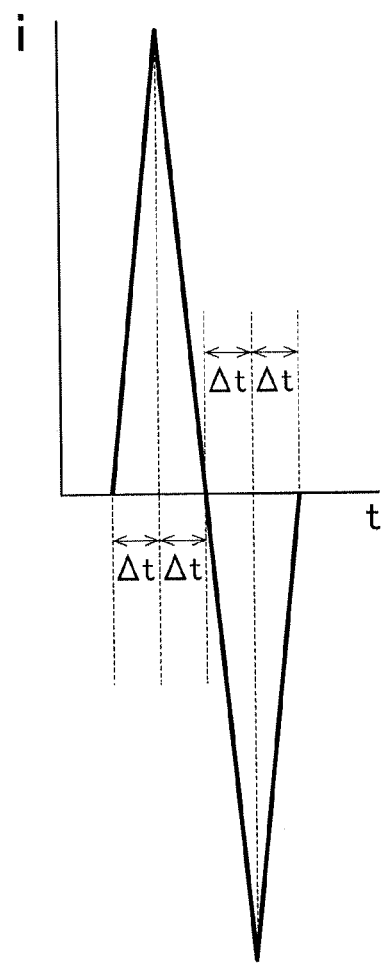
FIG. 2B is the wave current for calculating the pulse converted frequency.

The test results of the magnetometer with the Buffer circuit described above (hereafter the example of the invention) compared to the magnetometer without the Buffer circuit (hereafter the comparative example) are shown about the measurement on sensitivity and noise. In this case, the CoFeSiB alloy amorphous wire with the length of 0.6 mm and the diameter of 10 μm is used as the magnetic material of the wire. The pulse current of 150 mA with the pulse width of 10 ns, the rising time or falling time of 0.5 ns and pulse frequency of 50 Hz is applied. And the pulse converted frequency defined as one cycle time equal to 4 Δt shown in FIG. 2B becomes 0.5 GHz calculated by the above rising time or falling time.

Both of the pickup coil with the length of 0.6 mm, the coil pitch of 7.5 μm, and the coil numbers of 40 turns and the holding capacitance of 15 pF are used. The sensitivity of the comparative example is 16 mV/Gauss. On the other hand, the sensitivity of the example of the present invention is improved to be 26 mV/Gauss. Under same conditions, the noise of the comparative example is 2 mG but the noise of the example of the present invention is decreased to be 1 mG.

The above test results made clear that the magnetometers equipped with the Buffer circuit can achieve the high sensitivity and low noise.

REFERENCE SIGNS LIST 10 detector part
20 pulse generator circuit
30 Buffer circuit
40 sample holding circuit
50 amplifier circuit

The invention claimed is:
1. A magnetometer comprising:
a detector part with a magnetosensitive material to the magnetic field and a coil surrounding its magnetosensitive material to pick up the magnetic field;
a pulse generator circuit to supply the pulse current to the magnetic material; and
a sample holding circuit comprising an electronic switch synchronized with pulse current timing for switching on/off and a holding capacitance to charge electricity produced by the pickup coil during the period of switch on, and an amplifier circuit to amplify the voltage of the holding capacitance,
the magnetometer comprising the magnetosensitive material to the magnetic field is a soft magnetic alloy with amorphous state,
the pulse current with the pulse converted frequency of 0.3 GHz to 3 GHz, the holding capacitance with the capacity of 10 pF to 100 pF, wherein the magnetometer equipping a Buffer circuit which connects the output side of the pickup coil with the input side of the Buffer circuit and connects the output side of the Buffer circuit with the input side of the electronic switch to transfer the pulse signal voltage induced in the pickup coil from the input side to the output side to keep the pulse signal voltage of the outside at the same level as that of the inside, and the magnetometer constituted by a magneto impedance sensor.

2. The magnetometer according to claim 1, wherein the Buffer circuit with the frequency band is operated by the pulse current with the pulse converted frequency of 0.4 GHz to 2 GHz.

3. The magnetometer according to claim 1, wherein the holding capacitance with the capacity of 12 pF to 30 pF.

4. The magnetometer according to claim 1, wherein the soft magnetic alloy is a CoFeSiB alloy.

* * * * *